Oct. 24, 1961 R. A. WOOD 3,005,935
TRANSISTOR CONTROL CIRCUIT
Filed Nov. 12, 1957
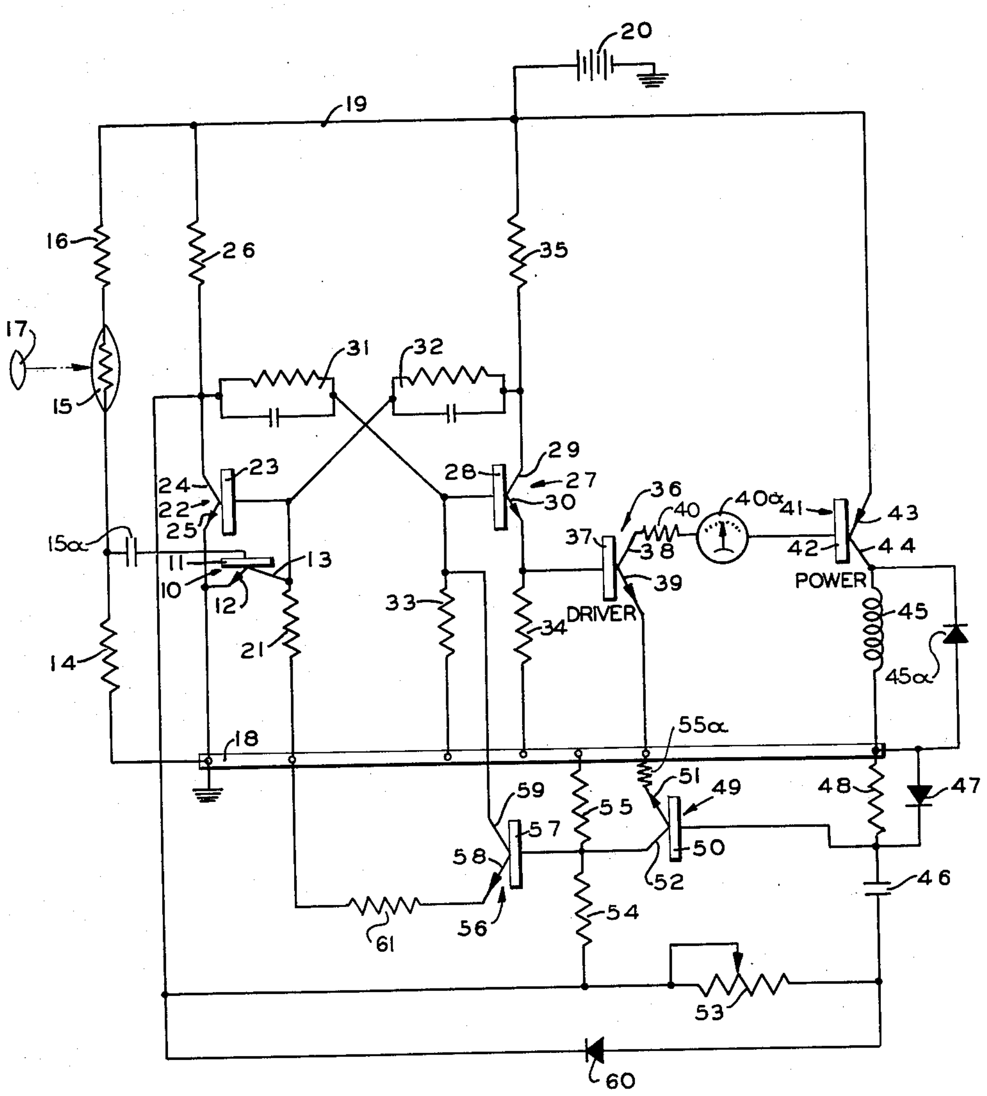
INVENTOR.
RICHARD A. WOOD
BY Allen & Chromy
ATTORNEYS 3,005,935

TRANSISTOR CONTROL CIRCUIT

Richard A. Wood, Sunnyvale, Calif., assignor, by mesne assignments, of one-half to Genevieve I. Magnuson, and one-half to Genevieve I. Magnuson, Robert Magnuson, and Lois J. Fox, as trustees Filed Nov. 12, 1957, Ser. No. 695,682
15 Claims. (Cl. 317—148.5)

This invention relates to an electrical control circuit employing semi-conductor devices. More particularly this invention relates to control circuits employing semi-conductor devices for electrically timing various operations.

An object of this invention is to provide an improved control circuit employing semi-conductor devices.

Another object of this invention is to provide an improved electrical timer of very compact construction.

Another object of this invention is to provide an improved electrical timer employing semi-conductor devices in which certain of said devices are arranged so as to compensate for the effects of temperature rise therein.

Still another object of this invention is to provide an improved electrical timer employing semi-conductor devices connected so that the effect of temperature rise in one of the semi-conductor devices tends to compensate for the effect of temperature rise in another of said semi-conductor devices whereby rise in temperature does not affect the timing of the circuit.

Still another object of this invention is to provide an improved electrical timer employing semi-conductor devices, said timer being constructed to provide highly stable and reliable operation.

A further object of this invention is to provide a transistor circuit that is connected to control the charging of a capacitor for the purpose of timing the operation of a mechanical device or another electrical circuit.

Other and further objects of this invention will be apparent to those skilled in the art to which it relates from the following specification, claims and drawing.

In accordance with this invention there is provided an electrical circuit which employs a plurality of transistor type of semi-conductor devices for the purpose of providing a timing control. This circuit employs a transistor the conductivity of which is controlled by means of a light sensitive cell or other type of switching arrangement. This transistor is connected to control the conductivity of a normally conductive transistor whereby, when this normally conductive transistor is rendered non-conductive, a pulse is transmitted to a third transistor which controls a driver transistor that in turn drives a power transistor connected to control the energization of a solenoid device that may be employed to control another circuit or perform a desired mechanical operation which is to be timed.

The timing of the operation is arranged to be controlled by the charging of a storage device such as a capacitor which is connected through a resistor to the collector electrode of the second transistor. The charging of this capacitor is initiated when the second transistor is rendered non-conductive, and the rate of charging may be controlled by a variable resistor. A fixed resistor connected in series with this capacitor is arranged to provide the operating bias potential for the base of another transistor so that this latter transistor is rendered conductive thereby and it in turn controls the conductivity or bias potential of a still further transistor which in turn is arranged to control the bias potential of the base of the third transistor. The voltage drop across this fixed resistor, which may be of the thermistor or other temperature sensitive type, is employed as a control potential which is responsive to the charging of the capacitor. It therefore indirectly functions to control the duration during which the solenoid is energized.

This voltage is employed for providing a bias potential to control the conductivity of an auxiliary transistor which in turn controls the conductivity of another auxiliary transistor. These auxiliary transistors are connected so that one tends to compensate for the effect of temperature rise in the other. The fixed resistor referred to above which may be a temperature sensitive resistor of the thermistor type in which the resistance goes down with rise in temperature, furnishes the bias potential for the base of the first auxiliary transistor. The current in the base of the first auxiliary transistor therefore goes down with temperature rise and this auxiliary transistor will cease conducting uniformly even at higher temperatures. Since the second auxiliary transistor requires less bias potential on its base to render it conductive at higher temperature the operation of the first transistor tends to compensate for increase in conductivity with rise in temperature.

When the capacitor is charged, the voltage drop across the fixed resistor drops to a point where it is no longer sufficient to furnish the desired bias for the first auxiliary transistor associated therewith. As a result the transistor connected across the bias resistor of the third transistor is rendered non-conductive. The second transistor is then triggered into conductivity with the result that the capacitor is rapidly discharged through a pair of diodes that are connected in series therewith.

The circuit is then ready for the next cycle of operation and this is initiated as before by applying a voltage control signal to the first transistor.

Further details of this invention will be set forth in the following specification, claims and in the drawing in which briefly the sole FIGURE is a schematic wiring diagram of an embodiment of this invention.

Referring to the drawing in detail reference numeral 10 designates a transistor having a base 11, an emitter electrode 12 and a collector electrode 13. The base 11 of this transistor is coupled to the upper terminal of the resistor 14 through the coupling capacitor 15*a* and the lower terminal of this resistor is connected to the grounded line 18, which may be in the form of the metal housing cabinet of this apparatus. The resistor 14 is the lower member of a voltage divider network including the light responsive resistance device 15 and the resistor 16, these elements 14, 15 and 16 being connected in series between the grounded line 18 and the line 19 which is connected to the positive terminal of the current supply 20.

The emitter electrode 12 of the transistor 10 is also connected to the grounded line 18 and the collector electrode 13 of this transistor is connected to the upper terminal of the resistor 21, the lower terminal of which is also connected to the grounded line 18. The emitter electrode 12 and the collector electrode 13 are also connected to the emitter electrode 25 and to the base 23, respectively, of the transistor 22. The base 23 of the transistor 22 is also connected to the upper terminal of the resistor 21 and this resistor thereby functions to develop the proper bias potential for the base of this transistor as will be described more fully hereinafter.

The collector electrode 24 of the transistor 22 is connected to the positive line 19 through the resistor 26. This collector electrode is also connected to the base 28 of the transistor 27 through the RC network 31 which comprises a capacitor shunted by a resistor. Likewise the base 23 of the transistor 22 is connected to the collector electrode 29 of the transistor 27 through the RC network 32 which also comprises a resistor shunted by a capacitor. The base 28 of the transistor 27 is also connected to the upper terminal of the resistor 33 which functions as a bias potential developing resistor and is connected between this base and the grounded line 18. The collector electrode 29 and one side of the RC network 32 are connected to the positive line 19 through the resistor 35 and the emitter electrode 30 is connected to the base 37 of the transistor 36 and also to the upper terminal of the resistor 34, the lower terminal of which is connected to the grounded line 18.

The transistor 36 functions as the driver for the power transistor 41 and for this purpose the collector electrode 38 thereof is connected to the base 42 of the transistor 41 through the matching resistor 40 and milliammeter 40*a*. This meter 40*a* may be eliminated if desired. The emitter electrode 39 of the transistor 36 is connected directly to the grounded line 18. The solenoid 45 is connected between the collector electrode 44 of the transistor 41 and the grounded line 18 and the electrode 43 is connected to the positive line 19. A diode 45*a* may be shunted around the solenoid 45 to absorb the counter electromotive force developed in this solenoid when the magnetic field thereof collapses, i.e., when the current therethrough is suddenly reduced.

The capacitor 46, which is preferably of a large capacity is connected with one terminal thereof to one side of the temperature sensitive resistor 48 of the thermistor type, and the other terminal thereof to one side of the variable resistor 53. The capacitor 46 and the resistors 48 and 53 are connected in series between the grounded line 18 and the collector electrode 24 of the transistor 22. The resistors 48 and 53 are shunted by the diodes 47 and 60, respectively, and these diodes are polarized so that the capacitor 46 may be discharged therethrough after it is fully charged. Since the value of the resistor 48 is relatively low the diode 47 may be eliminated.

The lower terminal of the resistor 48 is connected to the base of the transistor 49 and the emitter electrode 51 of this transistor is connected to the grounded line 18 through the matching resistor 55*a* of low value. The resistor 48 and resistor 55*a* are thus shunted across the transistor 49 from the base 50 to the emitter electrode 51 thereof. The collector electrode 52 of the transistor 49 is connected to the common terminal of the resistors 54 and 55 which are connected in series with the upper terminal of this series connected to the grounded line 18 and the lower terminal connected to one side of the variable resistor 53 and also to the lower terminal of the resistor 26, the upper terminal of which is connected to the positive line 19 whereby this series of resistors is connected between the positive line 19 and the grounded line 18, and functions as a voltage divider network. The common terminal of the resistors 54 and 55 is also connected to the base 57 of the transistor 56. The emitter electrode 58 of this transistor is connected to the grounded line 18 through the matching resistor 61 and the collector electrode 59 is connected to the upper terminal of the resistor 33 so that these two electrodes of this transistor are shunted across this resistor 33.

The operation of this circuit will now be described. When the circuit is energized by being connected to a suitable source of current supply, such as the supply 20, current flows through the resistor 26 and through the transistor 22 from the supply 20 so that a substantial part of the voltage of this supply will be taken up as a voltage drop across the resistor 26. Accordingly very little, if any, charging current will flow into the capacitor 46, at this time when the transistor 22 is conductive and the transistor 27 is non-conductive. However, upon the energization of the light sensitive cell or device 15 by means of light rays from the source 17, the resistance of this device drops substantially and as a result a current flows through the resistor 14, the device 15 and the resistor 16 from the source 20 so that a suitable bias potential is developed across the resistor 14 which is applied to the base 11 of the transistor 10 through the coupling capacitor 15*a*. As a result this transistor becomes conductive, and shunts the resistor 21 thereby removing the bias potential from the base 23 of the transistor 22 and rendering this transistor substantially non-conductive. At the same time a pulse is transmitted through the RC network 31 to the base of the transistor 27 because the voltage drop across the resistor 26 is reduced when the transistor 22 becomes non-conductive. The transistor 27, upon becoming conductive, supplies a current through the resistor 34 and a voltage drop is developed across this resistor so that the required positive bias is supplied to the base 37 of the transistor 36 which functions to drive the power transistor 41. The power transistor 41 thus supplies power to the solenoid 45 which functions to actuate the mechanical or electrical device as desired.

When the transistor 22 became non-conductive and the voltage drop across the resistor 26 was thereby reduced, the voltage across the capacitor 46 was increased and a charging current accordingly started to flow into this capacitor. This charging current is of course determined by the values of the resistors 26, 48 and 53 and the latter resistor is made variable so that this charging current may be controlled and the duration of charge of the capacitor 46 thus adjusted. The charging current provides a voltage drop across the resistor 48 which voltage drop functions to bias the base 50 of the transistor 49 and renders this transistor conductive so that the resistor 55 is effectively shunted and bias potential is not provided thereby to the base 57 of the transistor 56. This transistor 56 accordingly cannot function to shunt the resistor 33 at this time. However, when the capacitor 46 is fully charged and the voltage drop across the resistor 48 is reduced so that it is no longer sufficient to bias the base of the transistor 52, this transistor no longer effectively shunts the resistor 55, and as a result, the voltage drop across this resistor furnishes the required bias for the base 57 of the transistor 56. This transistor then functions to shunt the resistor 33 and the bias voltage of the base 28 of the transistor 27 is reduced to an ineffective value. Accordingly, this transistor 27 is then rendered non-conductive and the base 23 of the transistor 22 receives a pulse through the RC network 32 and this transistor is again rendered conductive. When the transistor 22 became conductive the capacitor 46 was discharged therethrough and through the diodes 47 and 60.

The resistor 48 may be of the thermistor type in which the resistance decreases as the temperature increases so that the current to the base 50 of the transistor 49 also decreases as temperature increases. This is an important consideration when using germanium transistors which require lower base biasing potentials at higher temperatures so that these transistors will continue to conduct at higher temperatures even though the base potential thereof is reduced. Accordingly, employing a resistor 48 having a negative temperature-resistance characteristic of the proper shape tends to compensate for the temperature conductivity characteristic of the transistor 49. Also inasmuch as the transistor 56 tends to become conductive at lower base potentials with rise in temperature, the transistor 49 functions to maintain the interval of conductivity of the former transistor uniform at higher temperatures.

It will of course be apparent that circuit elements having various values may be used and without limiting this invention thereto the following values are given as suitable where transistors 10, 22, 27, 52 and 56 are of npn type 2N35, transistor 36 is of npn type 2N214 and transistor 41 is of pnp type 2N242 and the voltage of the supply 20 is 12 volts.

Resistors:

| | | |
|---|---|---|
| **14** | kilo-ohms | 27 |
| **16** | do | 68 |
| **21** | do | 8.2 |
| **26** | do | 3.3 |
| **33** | do | 8.2 |
| **34** | ohms | 180 |
| **35** | kilo-ohms | 3.3 |
| **40** | ohms | 100 |
| **48** | kilo-ohms | 1 |
| **53** | do | 0 to 25 |
| **54** | do | 100 |
| **55** | do | 55 |

RC31 and 32 each have a resistor of 2 kilo-ohms and a capacitor of 800 mmf. Capacitor 46=50 microfarads.

Light sensitive device 15 has very high dark impedance and low impedance when illuminated.

Various modifications may be made in this invention, for example the resistance device 15 may be replaced by a switch that is actuated by a mechanical linkage or device for timing purposes instead of using a light as is necessary when the device 15 is used. Where the device 15 is replaced by a switch, closing said switch functions to apply the proper voltage across the resistor 14 which acts as the bias potential for the base 11 of the transistor 10 as before. The device 15 may also be eliminated and the lower terminal of the resistor 16 may be connected to the upper terminal of the resistor 14 which latter resistor may be shunted by a normally closed switch. Thus opening this normally closed switch functions to permit a voltage drop to develop across the resistor 14 sufficient to bias the base of the transistor 10.

While I have described an embodiment of this invention in detail it is not desired to limit this invention to the details set forth except insofar as they are defined by the following claims.

What I claim is:

1. An electrical timing circuit comprising a pair of semi-conductor devices, means connecting said devices together and to a source of current supply, means connected to said devices for controlling the electrical conductivity thereof so that only one of said devices is electrically conductive at a given time, one of said devices being initially conductive, means connected to said initially conductive device responsive to a signal for reducing the conductivity of the initially conductive device so that the other of said pair of devices becomes conductive, a control solenoid, a storage device, means for energizing said solenoid and means for charging said storage device while the other of said devices is conductive, and means connected to said storage device for reducing the conductivity of said other device when said storage device is charged so that the energizing current through said solenoid is reduced, said last mentioned means including temperature responsive means responsive to the charging current of said capacitor, and means for connecting said temperature responsive means to said other semi-conductor device to substantially eliminate effects of temperature variations on the operation thereof.

2. An electrical timing circuit as set forth in claim 1, further characterized in that the means connected to said storage device comprises a semi-conductor device having means connected thereto for controlling a bias potential on said other device.

3. An electrical timing circuit as set forth in claim 1, further characterized in that the means connected to said storage device comprises a pair of semi-conductor devices connected in cascade and the second device of said cascade being connected to said other device to control a bias potential thereof.

4. An electrical timing circuit as set forth in claim 1, further characterized in that the means for energizing said solenoid comprises a semi-conductor connected in series with said solenoid and means for controlling the conductivity of said last mentioned semi-conductor.

5. An electrical timing circuit as set forth in claim 3, further characterized in that the temperature responsive means comprises a temperature responsive resistor in series with said storage device, said resistor having a voltage drop thereacross produced by the charging current of said storage device, and means for connecting said resistor to one of said cascade of semi-conductor devices to supply the bias potential thereof.

6. An electrical timing circuit as set forth in claim 5, further characterized in that there is provided a semi-conductor device across said resistor, said last mentioned semi-conductor being connected to carry the discharge current from said storage device during discharge thereof.

7. An electrical timing circuit as set forth in claim 6, further characterized in that there is provided an additional resistance in series with said storage device for controlling the charging thereof and an additional semi-conductor device connected across said additional resistance also to carry discharge current from said storage device.

8. A control circuit comprising a pair of semi-conductor devices, means for connecting said devices so that they are electrically conductive alternately and a predetermined one thereof is initially conductive when the circuit is energized, a third semi-conductor device connected to control the conductivity of the initially conductive device, means for applying a signal to said third semi-conductor device to reduce the conductivity of the initially conductive one of said pair of devices whereby the other of said pair of devices becomes conductive, a storage device, a solenoid, means for energizing said solenoid when the other of said pair of devices becomes conductive, means for charging said storage device when the other of said pair devices becomes conductive, and means connected to said storage device for reducing the conductivity of the other of said pair of devices when said storage device is charged so that the initially conductive one of said pair of devices again becomes conductive and energization of said solenoid is interrupted, and means for connecting said storage device to said initially conductive semi-conductor device for discharging said storage device therethrough when it is conductive.

9. A control circuit for electrically timing the operation of an electrical circuit comprising a pair of semi-conductor devices, means connecting said devices together and to a source of current supply, means connected to said devices for controlling the electrical conductivity thereof so that only one of said devices is electrically conductive at a given time, one of said devices being initially conductive, means including a third semi-conductor device responsive to a signal for reducing the conductivity of the initially conductive device so that the other of said pair of devices becomes conductive, a control solenoid, a storage device, means for energizing said solenoid while the other of said devices is conductive, means for charging said storage device while said initially conductive device is non-conductive, means connected to said storage device for reducing the conductivity of said other device when said storage device is charged so that the energizing current through said solenoid is reduced.

10. A transistor control circuit comprising a pair of transistors, means for connecting said transistors so that they are electrically conductive alternately and a predetermined one thereof is initially conductive when the circuit is energized, a third transistor connected to control the voltage bias of an electrode of the initially conductive transistor whereby the other of said pair of transistors becomes conductive, means for supplying a signal controlled voltage to said third transistor, a storage device, a solenoid, means for energizing said solenoid when the other of said pair of transistors becomes conductive, means for charging said storage device when the other of said pair of transistors becomes conductive, means for reducing the conductivity of the other of said pair of transistors when said storage device is charged so that the initially conductive one of said pair of transistors again becomes conductive, said solenoid energizing means also including means for interrupting the energization of said solenoid when said storage device is charged, and means for discharging said storage device when said initially conductive transistor becomes conductive.

11. An electrical timing circuit as set forth in claim 10, further comprising a resistor having a negative resistance-temperature characteristic, means for connecting said resistor to said storage device, and a pair of transistors connected in series, connections for connecting the voltage drop across said last mentioned resistor to provide a bias potential for the first transistor of said series and connections between the second transistor of said series and the other of said first pair of transistors.

12. A transistor control and timing circuit comprising a transistor, means for rendering said transistor conductive, a storage device, a source of current supply, means for connecting said supply to charge said storage device, means for rendering said transistor nonconductive when said storage device is charged, said last mentioned means including temperature responsive means responsive to the charging current of said storage device, and connections for connecting said temperature responsive means to said transistor to reduce the effects of temperature variations on the operation thereof, and connections to said transistor for controlling an output circuit.

13. A transistor control and timing circuit comprising a transistor, means for rendering said transistor conductive, a storage device, a source of current supply, means for connecting said supply to charge said storage device, means for rendering said transistor nonconductive when said storage device is charged, said last mentioned means including a temperature responsive resistor connected in series with said storage device, and means for connecting said resistor to said transistor to reduce the effects of temperature variations on the operation thereof, and connections to said transistor for controlling an output circuit.

14. A transistor control and timing circuit comprising a transistor, means for rendering said transistor conductive, a storage device, a source of current supply, means for connecting said supply to charge said storage device, means for rendering said transistor nonconductive when said storage device is charged, said last mentioned means including temperature responsive means responsive to the charging current of said storage device, and connections for connecting said temperature responsive means to said transistor to reduce the effects of temperature variations on the operation thereof, and connections to said transistor for controlling an output circuit and semiconductor means connected to discharge said storage device.

15. A transistor control and timing circuit comprising a transistor, means for rendering said transistor conductive, a storage device, a source of current supply, means for connecting said supply to charge said storage device, means for rendering said transistor nonconductive when said storage device is charged, said last mentioned means including temperature responsive means responsive to the charging current of said storage device, and connections for connecting said temperature responsive means to said transistor to reduce the effects of temperature variations on the operation thereof, a solenoid, connections for connecting said solenoid to said transistor for energizing said solenoid when said transistor is conductive, and a semiconductor connected across said solenoid to prevent a high voltage from developing across said solenoid when the magnetic field thereof collapses.

References Cited in the file of this patent

UNITED STATES PATENTS

| | | |
|---|---|---|
| 2,476,389 | Schmidt | July 19, 1949 |
| 2,786,964 | De Witt et al. | Mar. 26, 1957 |
| 2,807,758 | Pinckaers | Sept. 24, 1957 |
| 2,814,736 | Hamilton | Nov. 26. 1957 |

OTHER REFERENCES

Garner: "Radio and Television News," October 1953. pages 68, 69 and 187.